United States Patent [19]
Bergmann

[11] 4,112,360
[45] Sep. 5, 1978

[54] APPARATUS AND METHOD FOR TUNING ELECTRO-MECHANICAL FILTER COMPONENTS

[75] Inventor: Horst Bergmann, Munich, Germany

[73] Assignee: Siemens Aktiengesellschaft, Berlin & Munich, Germany

[21] Appl. No.: 766,075

[22] Filed: Feb. 7, 1977

[30] Foreign Application Priority Data

Feb. 27, 1976 [DE] Fed. Rep. of Germany ....... 2608137

[51] Int. Cl.² .................................. G01R 23/00
[52] U.S. Cl. .................................. 324/80; 29/593; 333/71; 73/579
[58] Field of Search ............. 324/80; 29/25–35, 29/592, 593; 333/71; 73/67.2, 579

[56] References Cited

U.S. PATENT DOCUMENTS

| | | | |
|---|---|---|---|
| 2,712,753 | 7/1955 | Campbell | 324/80 |
| 2,887,877 | 5/1959 | Sharma | 73/67.2 |
| 3,823,470 | 7/1974 | Albsmeier et al. | 29/593 |

FOREIGN PATENT DOCUMENTS

| | | | |
|---|---|---|---|
| 1,245,507 | 7/1967 | Fed. Rep. of Germany | 324/80 |
| 186,047 | 10/1966 | U.S.S.R. | 333/71 |

*Primary Examiner*—Robert J. Corcoran
*Attorney, Agent, or Firm*—Hill, Gross, Simpson, Van Santen, Steadman, Chiara & Simpson

[57] ABSTRACT

Apparatus and method for tuning components of an electrical mechanical filter which includes a plurality of mechanical resonators coupled together with input and output resonators and other resonators mounted between the input and output resonators which can be tuned without mechanically damping the input and output resonators by providing an input feed circuit coupled to the input transducer and an output circuit coupled to the output transducer having characteristics such that the frequency of the resonator without a transducer can be accurately measured and wherein the frequencies of the input and output resonators do not adversely effect the frequency measurement of the resonator without a transducer.

5 Claims, 4 Drawing Figures

APPARATUS AND METHOD FOR TUNING ELECTRO-MECHANICAL FILTER COMPONENTS

BACKGROUND OF THE INVENTION

1. Field of the Invention

This invention relates in general to apparatus and method for tuning electromechanical filters and in particular the resonators of an electromechanical filter which are intermediate between the input and output resonators.

2. Description of the Prior Art

Electromechanical filters which comprise a plurality of mechanically vibrating resonators mechanically coupled together and with an input transducer on one of the resonators and an output transducer on another resonator and with at least one resonator mounted between the input and output resonators upon which no transducer is mounted are well known.

It is also well known that the satisfactory operation of electrical mechanical filters depends upon the individual resonators being tuned with a high degree of accuracy to specific predetermined resonant frequency. The individual resonators are manufactured and selected to be approximately at the correct frequencies, but due to unavoidable production tolerances the individual resonators of a completed filter after assembly must, in many instances, be additionally adjusted to the particular required resonant frequency. For example, the physical dimensions of a resonator determines its resonant frequency and the frequency can be adjusted by sand blasting or by using laser radiation so as to remove material from the resonators and, thus, change their frequencies. There is a difficulty of determining the resonant frequency of an individual resonator, however, because they are mechanically coupled to adjacent resonators and this coupling causes the adjacent resonators to influence the indicated tuning and leads to false indications of the resonant frequency of the particular resonator.

It is known in the prior art to avoid the influence of adjacent resonators on the resonator which is to be adjusted during the adjustment process to mechanically clamp the adjacent resonators so they cannot vibrate. For this purpose, expensive mechanical pressing mechanisms are required and such presses require that the clamping faces of the resonator be as flat as possible and that they be aligned parallel to one another. Such clamps make it difficult or impossible to tune by removing material on the clamping faces. Also, frequently it is not possible to effect clamping at those points of a resonator which are subject to the greatest amount of movement, since generally electrostrictive ceramics are used as transducers at the driving and output points of the resonator and if the clamping pressure is applied at those points, such clamping force would destroy the ceramic transducers.

German Pat. No. 1,245,507 suggests replacing mechanical clamping by so-called electrical clamping which is achieved by establishing the condition that those resonators which directly adjoin the resonator to be tuned operate as compound oscillators with their electrostrictive transducers and during tuning the transducers are connected in parallel with a coil having a value of an inductance which is such that together with the static capacitance of the electrostrictive transducers a parallel resonant circuit is formed which is tuned to the theoretical frequency of the resonator to be adjusted including the coupling element. In this manner, the resonators which are directly adjacent to the resonator which is to be tuned are heavily damped so that their effects on the resonator to be tuned are negligible during the adjustment process. The oscillation excitation and measurement of the oscillating frequency of the resonator to be tuned is however effected by the electrostrictive transducers which must be connected or coupled to the resonator to be tuned.

However, the adjustment of resonators which contain no transducers requires a different oscillation excitation and measurement to determine the resonant frequency. In this case, the resonator can be caused to oscillate with a drive device, for example, a driving coil with the aid of the magnetostriction effect. The resonant frequency of the resonator which is to be measured can be detected by a microphone mounted in the direction vicinity of the resonator and such signal is generally fed to a feedback amplifier which forms a measuring circuit together with the drive device and the microphone. This allows the desired resonant frequency to be measured. However, the self-resonant frequency of the resonator to be tuned is displaced in relation to the self-resonant frequency which occurs in the unmagnetized state. This frequency shift occurs as a result of the dependency of the module of elasticity E of the resonator material upon the degree of bias magnetization and in the case of some resonator materials using powerful bias magnetization values for the relative frequency change $\Delta_f/f$ can be up to $2 \cdot 10^{-4}$. A disadvantage of such oscillation measurement also results from the heavy microphone wear and tear which occurs during the sand blasting operation. Additionally, ultrasonic waves that occur during the sand blasting adjustment can cause erroneous measurements. Another disadvantage is that non-uniform magnetization of the individual resonators occurs with this technique due to unavoidable variations in the materials used in the resonators which makes it very difficult to automate this known process.

SUMMARY OF THE INVENTION

The invention relates to an apparatus and method for tuning adjustments of an electromechanical filter which contains at least two mechanically coupled mechanical resonators with one resonator being provided with an input electromechanical transducer having magnetostrictive action and at least one resonator provided with a magnetostrictive transducer and wherein at least one resonator contains no such transducers and in which each of the electrical mechanical transducers are connected in parallel with coils having inductance values which is such that the coils together with the static capacitances of the relevant electromechanical transducers form input and output parallel circuits for clamping the input and output resonators and such resonant circuits are tuned to the desired resonant frequency of the resonator which is to be tuned including the coupling elements which are connected to such transducer.

The object of the invention is to provide a process which avoids the difficulties of the prior art and which is suitable for tuning and measuring the resonant frequency of resonators within a mechanical filter which have no electrostrictive transducers connected to them.

In the invention, the adjustment of frequency of an electrical mechanical filter which contains at least two mechanically coupled mechanical resonators of which at least one resonator is provided with one or more electromechanical transducers which provide electrostrictive action and at least one resonator contains no such transducer and wherein each of the electromechanical transducers is connected in parallel with a coil having a value of inductance which is such that the coil together with the static capacitance of the relevant electromechanical transducer form input and output parallel circuits (input and output clamping circuits) which are tuned to the desired frequency of the resonator which is to be adjusted including the coupling elements connected thereto. This objective of the invention is accomplished during the tuning process of a resonator which has no electrostrictive transducers by feeding the input transducer with electrical energy with an input feed circuit having sufficiently high impedance that the clamping action of the input clamping circuit is changed only slightly and as the resonator which is to be tuned is fed with mechanical oscillating energy and simultaneously the resonant frequency of the resonator to be adjusted is measured by removing a signal from one of electrostrictive transducers through a high impedance measuring circuit.

It has proved advantageous to measure the resonant frequency of the resonator to be adjusted from the signal from the output transducer.

If the output transducer is not readily accessible for frequency measurement, the resonant frequency of the resonator to be adjusted can be measured by using the high impedance measuring circuit inserted into the feed circuit.

It is also advantageous to provide that the coils which are connected in parallel with the electrostrictive transducers be in the form of variable inductances and also to connect capacitors in parallel with the coils to form a parallel resonant circuit.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure and in which:

DESCRIPTION OF THE PREFERRED EMBODIMENTS

Figure 1:
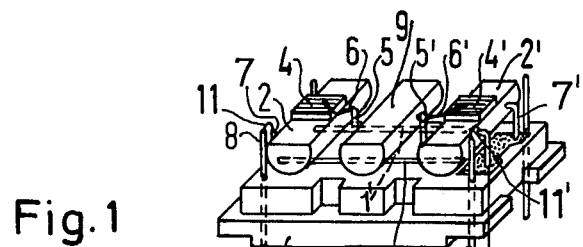
FIG. 1 illustrates a drive and an output measuring device according to the invention in association with a three element mechanical filter which is to be tuned.

FIG. 1 illustrates an electromechanical filter containing three resonators 2, 9 and 2' designed to operate in the bending oscillation mode and which are coupled together by two coupling wires 1 and 1' which extend parallel to each other and are attached to the surfaces of the resonators 2, 9 and 2'. The resonators 2, 9 and 2' are metal cylindrical rods which are formed with flatted portions which lie in a common plane which is parallel to the plane formed by the supporting base plate 3. Electromechanical transducers 4 and 4' are connected to the end resonators 2 and 2' on the flatted surfaces and the input electrostrictive resonator 4 converts input electrical energy into mechanical energy and causes the resonator 2 to oscillate in a bending mode and such oscillation is coupled to the intermediate resonator 9 by rods 1 and 1' and to the output resonator 2' by the coupling wires 1 and 1'. The output electrostrictive resonator 4' converts the mechanical bending vibration of the output resonator 2' into electrical energy. The electrostrictive transducers 4 and 4' may be in the form of plates as shown and may be formed with electrical conducting metalized portions. An electrical thin connection wire 6 extends from the metalized portion of the transducer 4 to a feed pin 5 which extends through the base member 3 as shown. A connection wire 6' is connected to a metalized electrical conducting portion of the transducer 4' and is connected to an electrical feed pin 5' which extends through the base 3. A second electrical connecting wire 11 extends from a connection pin 8 which extends through the base 3 and extends to the support element 7. The support element 7 is connected to the electrically conducting resonator 2 which in turn makes contact with the transducer 4. A second lead is connected to the resonator 4' and extends from the connecting pin 8' which extends through the base 3 through a connecting wire 11' which is connected to the support 7' as illustrated in FIG. 1 which makes contact with the resonator 2'. The support elements 7 and 7' comprise short angled metal pins which have very small thicknesses and have their upper ends connected to an oscillation node of the resonators 2, and 2' and their other ends are attached to the base plate 3. Thus, the support elements 7 and 7' of which there are two for each of the resonators 2 and 2' provide the mechanical support for the filter as well as providing the electrical path for the second connecting wires 11 and 11'.

Since the filter illustrated in FIG. 1, is of symmetrical construction either the resonator 2 or the resonator 2' can be the input resonator and the other one will be the output resonator. For purposes of description, it will be assumed that the resonator 2 is operated as the input resonator. When an electrical alternating voltage is connected between the supply pin 5 and the connection pin 8 of the outer resonator 2, the transducer 4 will excite the resonator 2 if the frequencies are within its pass band and will cause it to oscillate in the bending mode due to the expansions and contractions of the transducer plate 4 which is constructed of electrostrictive material and will oscillate due to the cross contraction effect. This bending oscillation of the resonator 2 will be coupled through the coupling wires 1 and 1' through the adjacent inner resonator 9 which is thus driven in bending oscillation. Due to the through coupling of the coupling wires 1 and 1', bending oscillations also occur in the outer resonator 2' and due to the piezoelectric effect the transducer plate 4' will produce an alternating voltage which can be removed from feed pins 5' and 8'. This piezoelectric action of the transducer plate 4' occurs between the metalization surface facing away from the resonator and the resonator 2'.

Electromechanical filters such as illustrated in FIG. 1 after manufacture and construction, must sometimes be tuned in the assembled arrangement and it is very difficult to tune the center resonator 9 as discussed above. The reason for this is that the oscillations of the resonators 2 and 2' will effect the resonant frequency of the resonator 9 if they are undamped and, therefore, it is necessary to substantially suppress the oscillations which occur in the outer resonators 2 and 2' when the center resonator 9 is being tuned. This can be accomplished in the known manner as described in German Pat. No. 1,245,507 with the use of inductance coils 10 and 10' illustrated in FIG. 1 which during the tuning process are connected between the pins 5 and 8 and pins 5' and 8' respectively, and wherein the coils 10 and 10' have inductance values which form with the static capacitance of the associated electrostrictive transducers 4 and 4' a parallel resonant circuit which has a resonant frequency tuned to the theoretical desired frequency of the resonator 9 including the coupling wires 1 and 1'.

In the present invention, instead of employing the conventional excitation of the central resonator with a magnetic field using magnetostriction principles which have the disadvantages described above and wherein a microphone is used to pickup sound waves from the resonator, in the present invention the oscillation excitation and the measurement of the frequency of the central resonator 9 are effected by electrically clamping the outer resonators 2 and 2' which are designed as compound oscillators. In the invention, during the tuning process of the resonator 9, electrical energy is fed from a feed circuit to the input transducer 4 from a circuit which has sufficiently high impedance to ensure that the Q of the input clamping circuit is only slightly reduced. This causes the compound oscillator 2 to act as a drive means of very low oscillation amplitude which does not substantially influence the resonant frequency of the central resonator 9 to which it is being coupled. Then the inherent resonant frequency of the resonator 9 which is being tuned can be measured with a high impedance measuring circuit connected to the output electrostrictive transducer 4' connected to the resonator 2'. This circuit will also in view of the electrical clamping, exert only a negligible influence on the resonant frequency of the central resonator 9.

In FIG. 1, the feed circuit comprises a transmitting oscillator G which can be varied in frequency and a high ohmic series resistor R1 which is connected to the coil 10 in parallel. The output measuring circuit of high impedance consists of a high ohmic resistor R2 connected in parallel with coil 10' and a measuring tunable receiver M which is connected across the resistor R2 and supplies an output to a frequency counter Z. It is generally desirable to select resistors R1 and R2 such that the oscillating efficiency of the clamping circuits is at least 50. The Q of the outer compound oscillators which include the resonators 2 and 2' are reduced due to the clamping from 3,000 to 10. As a result, the compound oscillators operate as driver and output with very low oscillation amplitudes and do not effectively influence the resonant frequency of the resonators to which they are coupled. In this manner, the resonant frequency of the central resonator 9 which is excited to resonate at high amplitude oscillations through the coupling wires 1 and 1' can be measured within wide limits uninfluenced by the properties of the outer compound oscillators.

Figure 2:
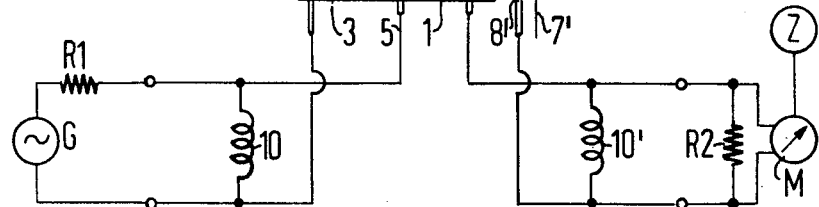
FIG. 2 is an electrical equivalent circuit diagram of the filter illustrated in FIG. 1 and includes the driving and measuring apparatus.

The electrical equivalent circuit of the arrangement illustrated in FIG. 1 is illustrated in FIG. 2 and is drawn for a three resonator mechanical filter such as illustrated in FIG. 1. The feed circuit is again represented by the generator G, the series resistor R1 and the inductance coil 10 which is connected across the pins 5 and 8. The measuring circuit comprises the measuring receiver M which is connected to the frequency counter Z and the parallel resistor R2 is connected across the meter and in parallel with the inductance coil 10' which has its opposite ends connected to the pins 5' and 8'. The resonator 2 which is constructed as a compound oscillator is represented by a series resonant circuit V located in the series arm and comprising the capacitive element C1 and the inductive element L1. The central resonator 9 is represented by the series resonant circuit 9' comprising the capacitor C9 and the inductance L9. The second outer resonator 2' which is in the form of a compound oscillator is represented by a series resonant circuit V' which in the series arm comprises an inductor L2 and a capacitor C2 and the resonant circuits V and V' are connected to opposite sides of the series resonant circuit representing the central resonator 9'. In shunt across terminals 5 and 8 and 5' and 8', respectively, are capacitances Cp1 and Cp2 which represent the static capacity of the electrostrictive transducers 4 and 4', respectively. Between the resonant circuit V and the resonant circuit 9' in the shunt arm of the circuit, there is provided a capacitance C$k$ which represents the effect of the coupling wire 1. A coupling capacitance C$k'$ between the resonant circuit 9' and V' also simulates the effect of the coupling wire 1'. The input and outputs respectively of the four pole circuits between terminals 5, 8, 5' and 8' are provided with the coils 10 and 10' which have inductances which are selected such that with the capacitances Cp1 and Cp2, respectively, they form a parallel resonant circuit which is tuned to the theoretical desired frequency of the central resonator 9 and, thus, act as clamping circuits as is known from German Pat. No. 1,245,507. Thus, for the desired frequency of the central resonator 9 the meshes I and II are isolated from the remainder of the four pole circuit because the clamping circuits have very high impedance for this frequency, and, thus, alternating currents at this frequency fed in at the terminals 5 and 8 are blocked.

With a correspondingly high ohmic feed-in impedance from the generator G and the resistor R1, which in a preferred embodiment might have resistance values of approximately 100k ohms, due to such attenuation by the clamping circuit, the resonator 2 will be excited to oscillate with oscillations of low amplitude at the theoretical frequency of the central resonator. As can be observed from the circuit of FIG. 2, the inner resonator 9 will be excited to oscillate at high amplitudes through the coupling wires 1 and 1' which are represented in the equivalent electrical circuit by the coupling capacitance C$k$ illustrated in the shunt arm. The electrically clamped series resonant circuit V' which is coupled by the second coupling capacitor C$k'$ to the series resonant circuit 9' will be excited to oscillate at low amplitudes at a frequency which is the frequency of the resonant circuit 9' and the output will be measured by the high impedance measuring circuit to give the accurate resonant frequency of the inner resonator 9.

Figure 3:
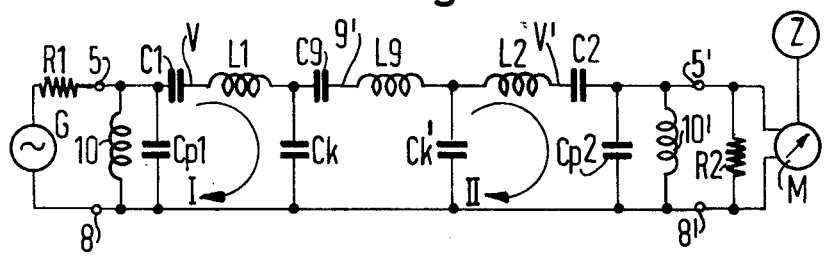
FIG. 3 is an electrical schematic of a modification of the measuring arrangement illustrated in FIG. 2.
Figure 3:
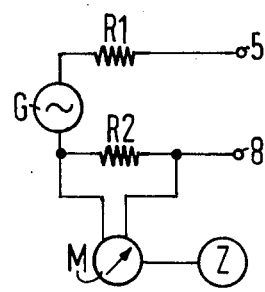

A modification of the invention is illustrated in FIG. 3 wherein the resonator is tuned under conditions for example, if the output transducer 4' is not readily accessible to a measuring device and wherein both the feed and measuring circuits are coupled to the resonator 2. In this embodiment, the measuring circuit is disconnected from the terminals 5' and 8' and the resistor R2 is connected between the second side of the generator G between the pin 8 and the generator as shown in FIG. 3. The meter M is connected across the resistor R2 and supplies an output to the frequency counter Z. This circuit makes it possible to excite the mechanical filter and detect and measure the frequency of the inner resonator 9 by coupling both the input and output to pins 5 and 8.

The tuning process according to the invention can also be applied to oscillators where adjacent resonators are not provided with transducer elements. For this situation, when an adjacent resonator is not provided with a transducer, there will occur in the conductance planes two inner conductance maxima between two outer conductance maxima corresponding to the resonant frequencies of the clamping circuits and these two inner conductance maxima correspond to the resonant frequencies of the adjacent resonators which do not have transducer elements. These neighbouring conductance maxima have a specific minimum spacing of $\Delta_f$.

Figure 4:
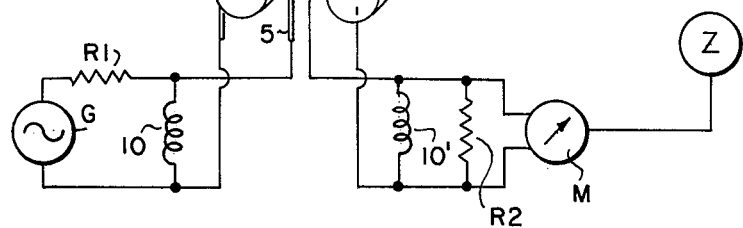
FIG. 4 illustrates a modification of the invention.

The tuning process according to the invention can also be utilized for mechanical filters which consist of only two mechanical resonators coupled to each other and in which the input and output transducer elements are mounted on one of these resonators FIG. 4 illustrates this embodiment where a single mechanical resonator 2 has both of the transducers 4 and 4' mounted thereon. The other resonator 9 is coupled to the resonator 2 with coupling wires 1 as shown. The input and output circuits are respectively connected to the transducers 4 and 4' in the same manner as in FIG. 1.

Although the invention has been described with respect to preferred embodiments, it is not to be so limited as changes and modifications may be made which are within the full intended scope of the invention as defined by the appended claims.

I claim as my invention:

1. A process for the tuning of a resonator by frequency adjustment of an electromechanical filter which comprises two electromechanical transducers capable of operating in electrostrictive action, two end mechanical resonators on which said electromechanical transducers are mounted, at least one other resonator without such a transducer, said two end and said other resonators being coupled together by mechanical coupling elements, two coils respectively connected to said two end transducers and said coils having an inductance value which is such that said coils together with the static capacitance of the respective one of said two end electromechanical transducers form parallel resonant clamping circuits which are tuned to the desired resonant frequency of said other resonator which is to be tuned and including the coupling elements connected thereto, including the steps wherein during the tuning process which is carried out on said other resonator one of said transducers is fed with electrical energy tunable over a frequency range from a feed circuit which has sufficient high ohmic impedance to assure that the quality factor of this clamping circuit is only slightly changed, the resonator connected to this clamping circuit thereby feeding said other resonator with low amplitude mechanical oscillations of the desired frequency, and simultaneously the resonant output frequency of said other resonator is measured by a measuring circuit having a high input impedance connected to one of said clamping circuits.

2. A process according to claim 1 wherein the measuring circuit is connected to one of the clamping circuits and the feed is connected to the other of the clamping circuits.

3. A process for the tuning of a resonator by frequency adjustment of an electromechanical filter which comprises two electromechanical transducers capable of operating in electrostrictive action and a first mechanical resonator upon which said two electromechanical transducers are mounted, at least one other resonator without a transducer, the first and said other resonators coupled together by mechanical coupling elements, said two transducers each respectively connected in parallel with a separate coil having an inductance value which is such that said coils, together with the static capacitance of its associated electromechanical transducers form parallel resonant clamping circuits which are tuned to the desired resonant frequency of said other resonator which is to be tuned and including the coupling elements connected thereto, including the steps wherein during the tuning process of said other resonator one of said two transducers is fed with electrical energy tunable over a frequency range from a feed circuit which has sufficient high ohmic impedance to assure that the quality factor of this clamping circuit is only slightly changed, the resonator connected to this clamping circuit thereby feeding said other resonator with low amplitude mechanical oscillations of the desired frequency, and simultaneously the resonant output frequency of said other resonator is measured by a measuring circuit having a high input impedance connected to the other of said clamping circuits so as to determine the resonant frequency of said other resonator.

4. Apparatus for tuning intermediate resonators of an electromechanical filter having a plurality of parallel mounted resonators with an input resonator on a first end of said filter and an output resonator on the second end of said filter, input and output transducers mounted, respectively on said input and output resonators, coupling means extending between said input and output resonators, at least one intermediate resonator mounted between said input and output resonators and coupled to said coupling means, a first coil connected across said input transducer and having an inductance value such that with the static capacitance of said input transducer it forms a parallel resonant clamping circuit resonant at the desired frequency of said one intermediate resonator, a frequency tunable generator connected to said first coil, a first resistor of high impedance connected between said generator and said input transducer to assure that the quality factor of the clamping circuit is only slightly changed, a second coil connected across said output transducer and having an inductance value such that with the static capacitance of said output transducer it forms a parallel resonant clamping circuit resonant at the desired frequency of said one intermediate resonator, and measuring means connected to said second coil to indicate the resonant frequency of said one intermediate resonator a second resistor of high impedance connected between said output transducer and said measuring means.

5. Apparatus for tuning resonators of an electromechanical filter having a plurality of parallel mounted resonators, input and output transducers mounted on one of said resonators, coupling means extending between said one resonator and at least one other of said resonators, a first coil connected across said input transducer and having an inductance value such that with the static capacitance of said input transducer it forms a parallel resonant clamping circuit resonant at the desired frequency of said one other resonator, a frequency tunable generator connected to said first coil, a first resistor of high impedance connected between said generator and said input transducer to assure that the quality factor of the clamping circuit is only slightly changed, a second coil connected across said output transducer and having an inductance value such that with the static capacitance of said output transducer it forms a parallel resonant clamping circuit resonant at the desired frequency of said one other resonator, and measuring means connected to said second coil to indicate the resonant frequency of said one other resonator and a second resistor of high impedance connected between said output transducer and said assuring means.

* * * * *